United States Patent
Yang

(10) Patent No.: US 10,978,131 B2
(45) Date of Patent: Apr. 13, 2021

(54) MOBILE DEVICE AND OPERATION METHOD THEREOF

(71) Applicant: Samsung Electronics Co., Ltd., Suwon-si (KR)

(72) Inventor: Seung-soo Yang, Hwaseong-si (KR)

(73) Assignee: SAMSUNG ELECTRONICS CO., LTD.

( * ) Notice: Subject to any disclaimer, the term of this patent is extended or adjusted under 35 U.S.C. 154(b) by 373 days.

(21) Appl. No.: 15/136,873

(22) Filed: Apr. 22, 2016

(65) Prior Publication Data

US 2016/0358642 A1 Dec. 8, 2016

(30) Foreign Application Priority Data

Jun. 3, 2015 (KR) .................. 10-2015-0078668

(51) Int. Cl.
*G11C 11/406* (2006.01)
*G11C 11/4072* (2006.01)
*G11C 11/4076* (2006.01)
*G06F 13/16* (2006.01)

(52) U.S. Cl.
CPC ........ *G11C 11/406* (2013.01); *G06F 13/1636* (2013.01); *G11C 11/4072* (2013.01); *G11C 11/4076* (2013.01); *G11C 11/40603* (2013.01)

(58) Field of Classification Search
CPC .............................. G06F 3/0624; G06F 3/0659
See application file for complete search history.

(56) References Cited

U.S. PATENT DOCUMENTS

| | | | |
|---|---|---|---|
| 4,272,985 A | 6/1981 | Rapson, Jr. et al. | |
| 5,920,895 A * | 7/1999 | Perazzoli, Jr. | G06F 12/0866 |
| | | | 711/118 |
| 5,935,242 A * | 8/1999 | Madany | G06F 9/4411 |
| | | | 713/1 |
| 8,456,972 B2 | 6/2013 | Mehra et al. | |
| 8,719,513 B2 | 5/2014 | Agesen | |
| 8,812,817 B2 * | 8/2014 | Fuller | G06F 12/0802 |
| | | | 711/202 |
| 8,942,072 B2 | 1/2015 | Mehra et al. | |
| 8,947,988 B2 | 2/2015 | Mehra et al. | |
| 2003/0095459 A1 * | 5/2003 | Derner | G11C 11/406 |
| | | | 365/222 |

(Continued)

FOREIGN PATENT DOCUMENTS

KR 20140060308 5/2014

OTHER PUBLICATIONS

Seshadri, Vivek et al., "RowClone: Fast and Energy-Efficient In-DRAM Bulk Data Copy and Initialization," Carnegie Mellon University, Intel Pittsburgh, MICRO-46 Proceedings of the 46th Annual IEEE/ACM International Symposium on Microarchitecture, Dec. 7-11, 2013, 13 pages.

*Primary Examiner* — William E. Baughman
(74) *Attorney, Agent, or Firm* — Renaissance IP Law Group LLP

(57) ABSTRACT

Provided are a mobile device and an operation method of the mobile device. The operation method controlled by a central processing unit of the mobile device includes, in response to an initialization request with respect to a memory device of the mobile device, setting a first type area of the memory device, which is not initialized as a first value, and processing an operation command with respect to the first type area.

13 Claims, 15 Drawing Sheets

(56) References Cited

U.S. PATENT DOCUMENTS

| | | | |
|---|---|---|---|
| 2006/0087903 A1* | 4/2006 | Riho | G11C 11/40615 365/222 |
| 2007/0250283 A1 | 10/2007 | Barnum et al. | |
| 2011/0088084 A1* | 4/2011 | Yasaki | G06F 21/6218 726/5 |
| 2011/0296087 A1* | 12/2011 | Kim | G06F 12/0246 711/103 |
| 2013/0198246 A1* | 8/2013 | Scales | G06F 3/0608 707/821 |
| 2014/0189704 A1 | 7/2014 | Narvaez et al. | |
| 2014/0344513 A1 | 11/2014 | Lo et al. | |
| 2015/0068181 A1* | 3/2015 | Horstmann | A01D 37/00 56/131 |
| 2015/0095604 A1* | 4/2015 | Doi | G11C 11/40622 711/166 |
| 2015/0378615 A1* | 12/2015 | Ramanujan | G11C 7/20 711/103 |

* cited by examiner

MOBILE DEVICE AND OPERATION METHOD THEREOF

CROSS-REFERENCE TO RELATED APPLICATION

This application claims the priority under 35 U.S.C. § 119 to Korean Patent Application No. 10-2015-0078668, filed on Jun. 3, 2015, the entire contents of which are incorporated herein by reference in their entirety.

BACKGROUND

The inventive concept relates to a mobile device and an operation method thereof, and more particularly, to a mobile device and an operation method thereof which are capable of reducing power consumption or improving operation performance.

With requests for downsizing and high-performance of mobile devices, such as smart phones, tablet personal computers, and wearable devices, power consumption and memory bandwidths have become an issue in mobile devices.

SUMMARY

The inventive concept provides a mobile device and an operation method thereof capable of reducing power consumption or improving operation performance by controlling ineffective operations.

According to an aspect of the inventive concept, there is provided an operation method including in response to an initialization request with respect to a memory device of the mobile device, setting a first type area of the memory device, which is not initialized as a first value, and responding that the initializing request is completed with respect to the first type area without completing the initialization of the first type area.

According to another aspect of the inventive concept, there is provided a mobile device including a central processor configured to perform data processing for controlling the mobile device, a memory device configured to store data required for an operation of the central processor, and a zero data processor configured to generate a response for an operation command accompanied by an access to a first type area of the memory device without accessing the memory device and to transmit the generated response to the central processor, wherein the first type area is an area which is not initialized as zero data in response to an initialization request generated from the central processor.

According to another aspect of the inventive concept, there is provided a wearable device including a central processor, a memory device wherein all areas of the memory device, except a first type area, are initialized in response to an initialization request received from the central processor, and a zero data processor configured to generate a response for an operation command accompanied by an access to the first type area of the memory device without accessing the memory device and to transmit the generated response to the central processor.

BRIEF DESCRIPTION OF THE DRAWINGS

Example embodiments of the inventive concept will be more clearly understood from the following detailed description taken in conjunction with the accompanying drawings in which.

DETAILED DESCRIPTION OF THE EMBODIMENTS

Figure 1:
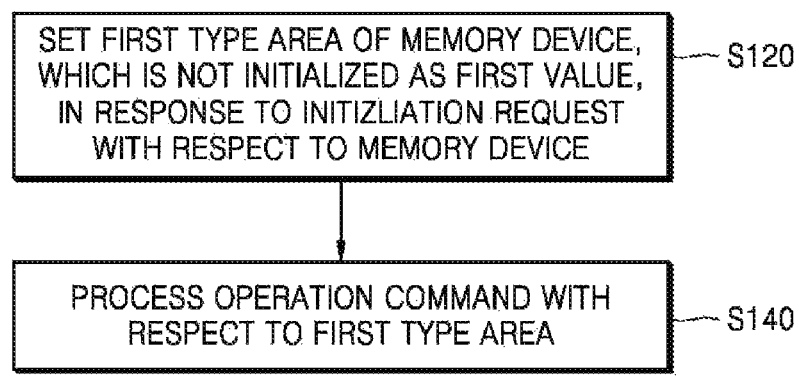
FIG. 1 is a view of an operation method of a mobile device, according to an example embodiment.

Reference will now be made in detail to example embodiments, examples of which are illustrated in the accompanying drawings, wherein like reference numerals refer to like elements throughout. Expressions such as "at least one of," when preceding a list of elements, modify the entire list of elements and do not modify the individual elements of the list.

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

As is traditional in the field of the inventive concepts, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the inventive concepts. Likewise, the blocks of the embodiments may be physically combined into more complex blocks without departing from the scope of the inventive concepts.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

FIG. 1 is a view of an operation method of a mobile device according to an example embodiment. Referring to FIG. 1, the operation method of the mobile device according to the present example embodiment includes, in response to an initialization request with respect to a memory device of the mobile device, setting a first type area of the memory device, which is not initialized as a first value (S120), and processing an operation command with respect to the first type area (S140).

Figure 2:
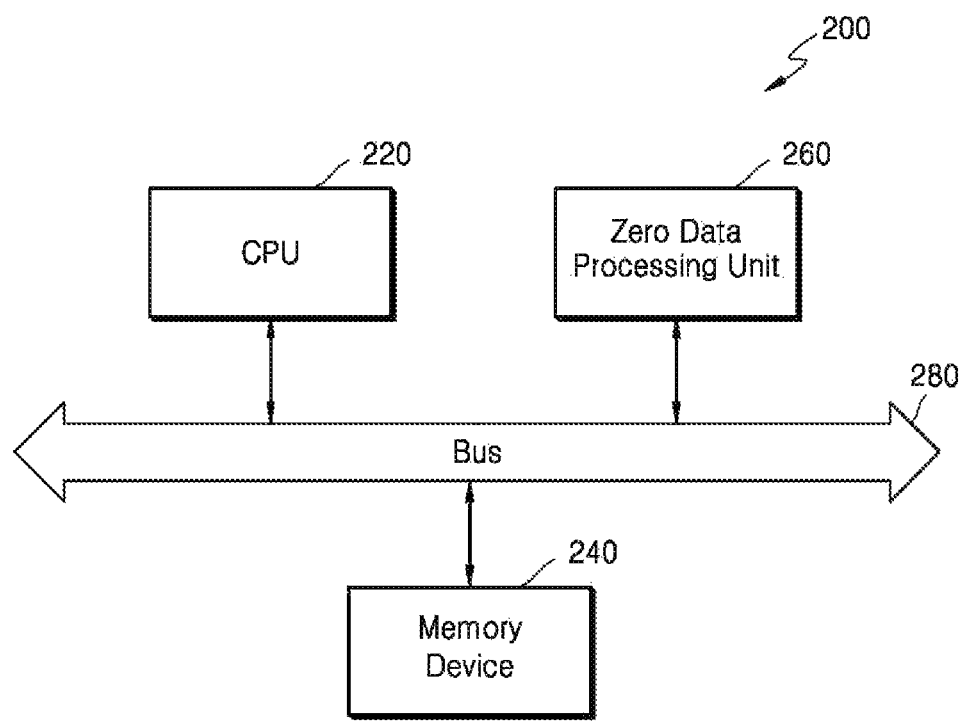
FIG. 2 is a view of an example of a mobile device according to an example embodiment.

The operation method of FIG. 1 may be executed in a mobile device 200 of FIG. 2. Referring to FIG. 2 illustrating the mobile device 200 according to an example embodiment, the mobile device 200 may include a central processing unit 220, a memory device 240, a zero data processing unit 260, and a bus 280. The central processing unit 220 may control various operations of the mobile device 200. For example, the central processing unit 220 may perform calculation and data processing for executing an application in the mobile device 200. The central processing unit 220 may be embodied as a multi-core central processing unit, and the performance of the multi-core central processing unit may be the same or different throughout. The central processing unit 220 may be included in an application processor, as it will be described later.

The memory device 240 may store data required for an operation of the central processing unit 220. For example, the data that is calculated or processed by the central processing unit 220 for executing an application may be loaded on the memory device 240. The memory device 240 may be, for example, dynamic random access memory (DRAM), magnetic RAM (MRAM), resistive RAM (RRAM), phase-change RAM (PRAM), and ferroelectric RAM (FRAM). However, hereinafter, for convenience of explanation, an example in which the memory device 240 is embodied as DRAM will be described. However, all or part of the operation method of the mobile device 200 according to the present example embodiment will be operated identically or similarly, even if the memory device 240 is embodied as MRAM, etc.

Figure 3:
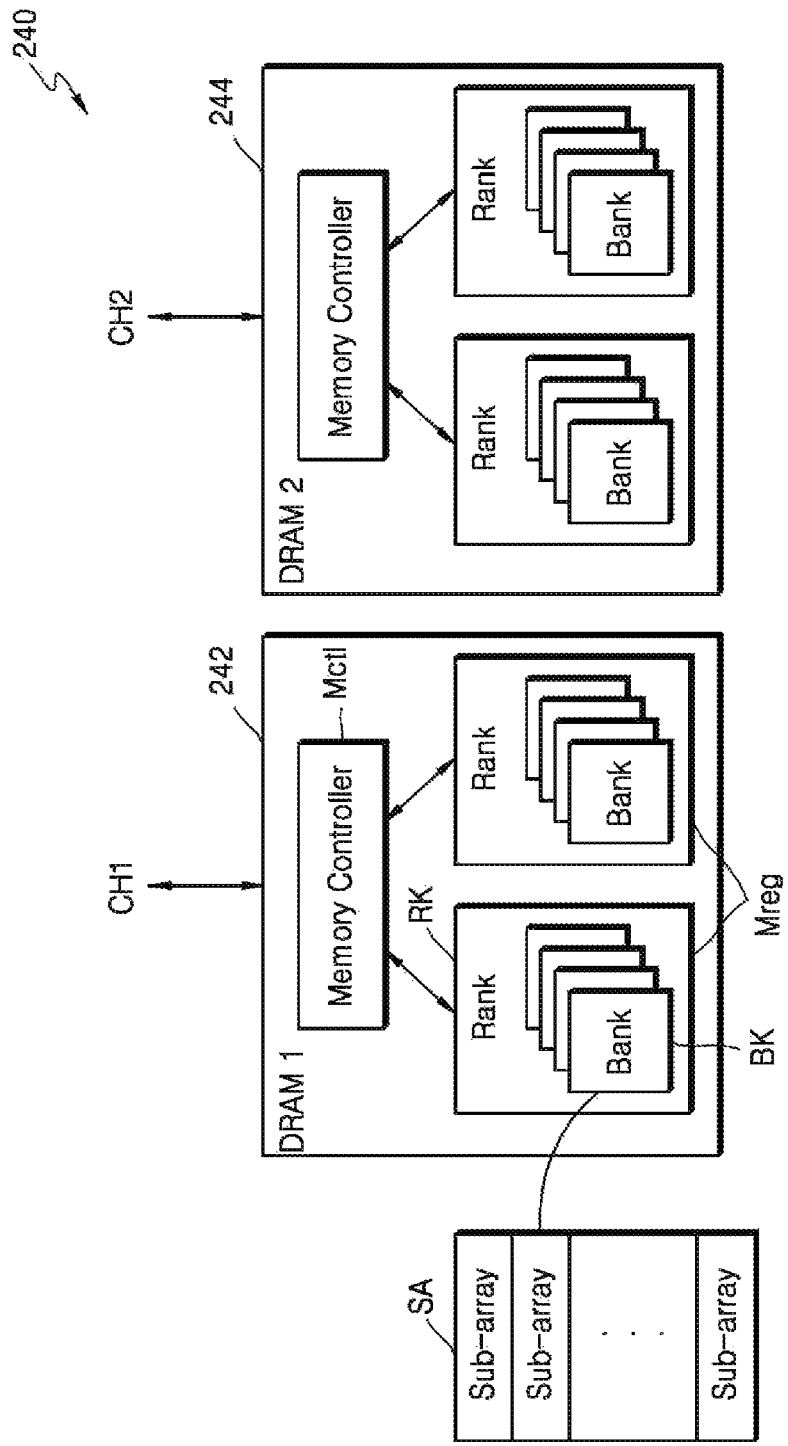
FIG. 3 is a view of a memory device according to an example embodiment.

The memory device 240 may be provided in a single or a multiple number. For example, as illustrated in FIG. 3 showing the memory device 240 according to an example embodiment, the memory device 240 may be embodied as at least two DRAMs 242 and 244. Each of the DRAMs 242 and 244 may be connected to the bus 280 of FIG. 2, by switching between channels CH1 and CH2. Each DRAM 242 and 244 may include a memory controller Mct1 and a memory region Mreg. Each memory region Mreg may include at least one rank RK, the rank RK may include a plurality of banks BK, and each bank BK may include a plurality of sub-arrays SA. Although not illustrated, each sub-array SA may include a plurality of blocks or pages. In the present disclosure, the page may be described as a unit for separating data used in an application.

Referring again to FIG. 2, the zero data processing unit 260 of the mobile device 200 may receive at least one of a plurality of requests with respect to the memory device 240, which are generated from the central processing unit 220, and may generate a response for the request without accessing the memory device 240. The plurality of requests with respect to the memory device 240, which are generated from the central processing unit 220, may be commands, such as a write command, a read command, and a refresh command, or a control signal, such as an initialization signal.

For example, the zero data processing unit 260 may receive an initialization request with respect to the memory device 240 from the central processing unit 220, and may set a first type area of the memory device 240, which is not initialized as a first value, in operation S120. For example, the zero data processing unit 260 may set the first type area in a unit of the channels CH1 and CH2 or the rank RK of FIG. 3. Alternatively, the zero data processing unit 260 may set the first type area in a unit of the bank BK or the sub array SA of FIG. 3. Alternatively, the zero data processing unit 260 may set the first type area in a unit of the block, the page, or in a unit smaller than the page. The first type area may be set in a multiple number.

The first value may be 0 indicating logic low. When one application is ended, the central processing unit 220 may initialize an area of the memory device 240, which is allocated for the application, as the first value, for example, the value of 0, for security, etc. The zero data processing unit 260 of the mobile device 200 may receive an initialization request of the central processing unit 220 with respect to a random area of the memory device 240, and may control the area not to be initialized. The zero data processing unit 260 may set the area of the memory device 240, which is not initialized, despite the initialization request, as the first type area.

The first type area may be set in the above initialization operation of the memory device 240, or, as it will be described later, may be set by a write command for writing zero data. The zero data may refer to data in which values of all bits are set as 0. In addition, the zero data processing unit 260 may receive a write command, a read command, and a refresh command for the first type area, and may generate a processing result of the command without accessing the memory device 240.

This aspect will be described in more detail later.

A response with respect to a processing result of a request for the memory device 240, etc. may be transmitted to the central processing unit 220 by the zero data processing unit 260, in operation S140. For example, the zero data processing unit 260 may transmit a response for the initialization request, which notifies that the initialization request with respect to the memory device 240 is received or processed, to the central processing unit 220. The zero data processing unit 260 may be embodied as a hardware module. Alternatively, the zero data processing unit 260 may be embodied as a software module.

The central processing unit 220, the memory device 240, and the zero data processing unit 260 may exchange signals and data with one another via the bus 280. Although not illustrated in FIG. 2, the mobile device 200 may further include a graphic processor, a digital signal processor, etc., which are connected to the bus 280.

According to the mobile device 200 and the operation method thereof according to an example embodiment, a scheme for performing a normal operation without performing initialization of the memory device 240 is provided so that power consumption caused by the initialization of the memory device 240 may be reduced. Alternatively, according to the mobile device 200 and the operation method thereof according to an example embodiment, a refresh operation is not performed on an area of the memory device 240, which is processed as an initialized area or as an area storing zero data, and thus, power consumption may be reduced and an operation delay may be prevented. Alternatively, according to the mobile device 200 and the operation method thereof according to an example embodiment, a scheme for performing a normal operation without accessing the memory device 240 is provided so that delay problems due to a limit of a physical bandwidth of the memory device 240 may be solved. Alternatively, when the memory device 240 is initialized, cache miss which may occur when performing a next write operation may be prevented, and thus, the performance of the mobile device 200 may be improved.

Hereinafter, the operation method of the mobile device 200 will be described in more detail.

Figure 4:
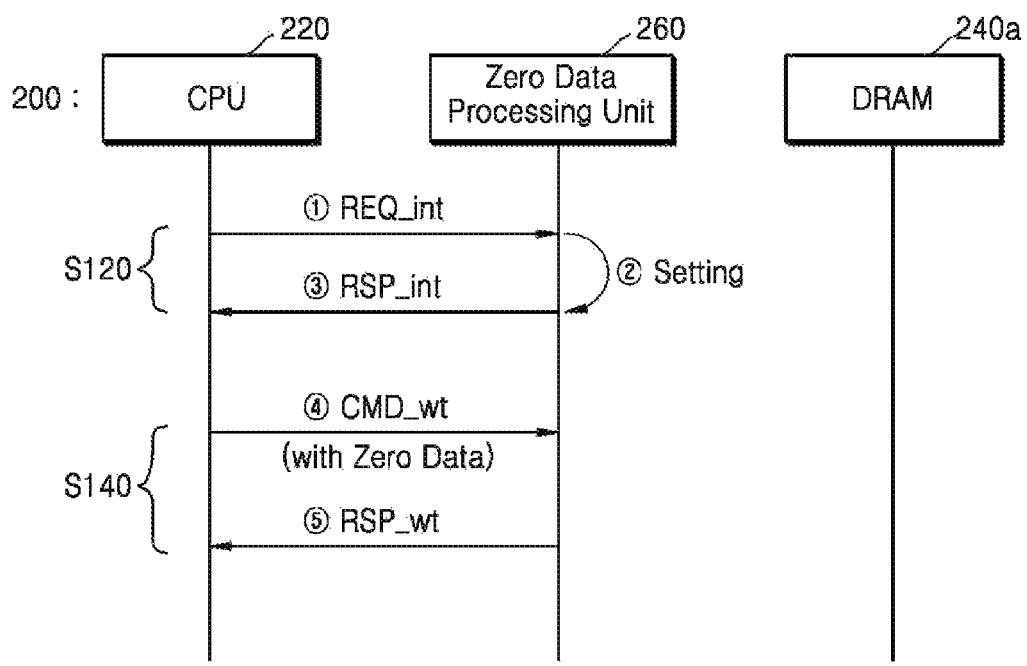
FIG. 4 is a view of an example of the operation method of the mobile device of FIG. 1, wherein an operation command with respect to a first type area is a write command for write data which is zero data.

FIG. 4 illustrates an example of the operation method of the mobile device 200 of FIG. 1, wherein an operation command with respect to the first type area is a write command for write data which is zero data. Referring to FIG. 4, the zero data processing unit 260 of the mobile device 200 may receive an initialization request REQ_int from the central processing unit 220 ①.

In response to the initialization request REQ_int, the zero data processing unit 260 may set the first type area, which is not initialized despite the initialization request REQ_int ②. The zero data processing unit 260 may set a plurality of first type areas in page units. In this case, the zero data processing unit 260 may store a value indicating that the page is the first type area, in a random entry of a look-up table with respect to each page. For example, when a first page, matching information of which is stored in a first index of the look-up table, is the first type area, the value of 1 may be stored in a random entry of the first index.

The zero data processing unit 260 may transmit a response RSP_int notifying that the initialization is performed, to the central processing unit 220, without accessing DRAM 240a, that is, without initializing an area of the DRAM 240a, which corresponds to a plurality of pages, for which the initialization is requested ③. Via this operation, power consumption caused by the initialization of the DRAM 240a may be reduced.

Then, when a write command CMD_wt for writing zero data in the first type area of the DRAM 240a is activated from the central processing unit 220 ④, the zero data processing unit 260 may not access the DRAM 240a, that is, may not perform a write operation, and may transmit a response RSP_wt indicating that the write command has succeeded to the central processing unit 220 ⑤. Here, the zero data processing unit 260 may determine whether a page corresponding to an address included in the write command is the first type area, by searching the look-up table. As shown above, the write operation by transmitting the zero data to the DRAM 240a is not performed, and thus, power consumption caused by the write operation may be reduced, and a delay which may be caused during a data exchange operation with the DRAM 240a, due to a limit of a bandwidth of the DRAM 240a, may be prevented.

Figure 5:
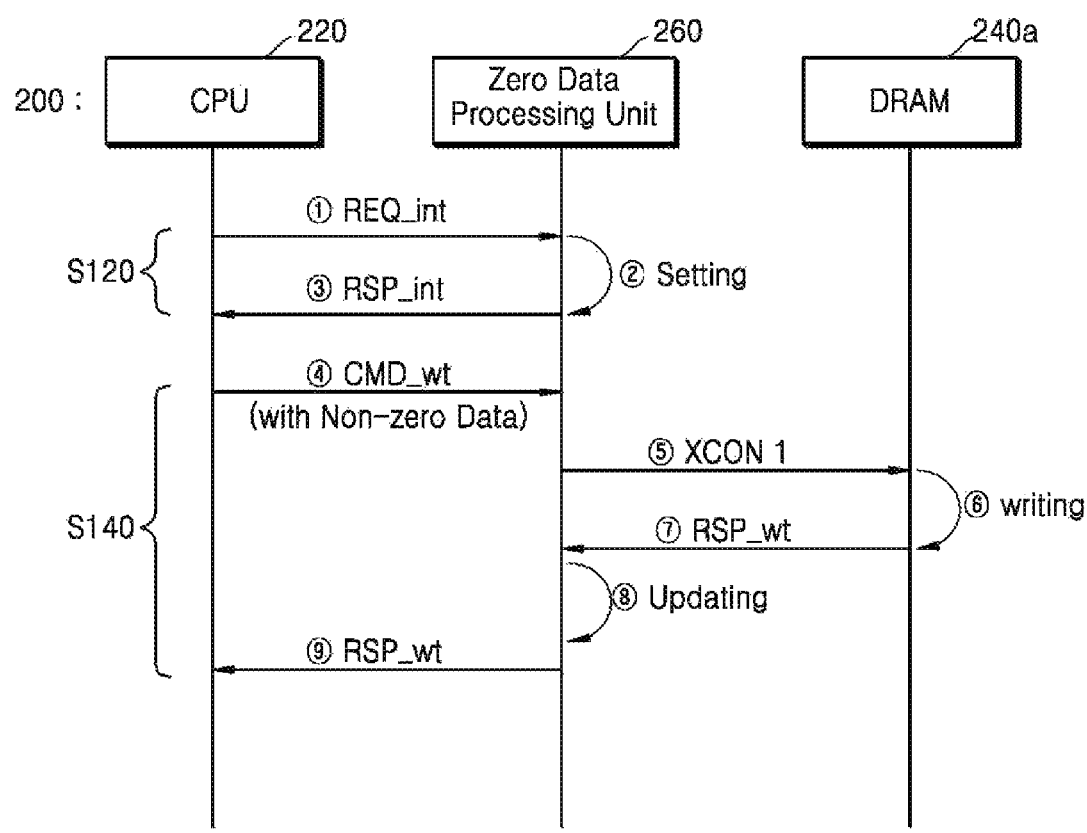
FIGS. 5 and 6 are views of examples of the operation method of the mobile device of FIG. 1, wherein an operation command with respect to a first type area is a write command for write data which is non-zero data.

FIG. 5 illustrates an example of the operation method of the mobile device 200 of FIG. 1, wherein the operation command with respect to the first type area is a write command for write data which is non-zero data. Referring to FIG. 5, the zero data processing unit 260 of the mobile device 200 may receive an initialization request REQ_int from the central processing unit 220 ①. In response to the initialization request REQ_int, the zero data processing unit 260 may set the first type area, which is not initialized despite the initialization request REQ_int ②. The zero data processing unit 260 may not initialize an area of the DRAM 240a, which corresponds to a plurality of pages, for which the initialization is requested, and may transmit a response RSP_int indicating that the initialization is performed, to the central processing unit 220 ③.

Then, when a write command CMD_wt for writing the write data which is non-zero data in the first type area is activated from the central processing unit 220 ④, the zero data processing unit 260 may transmit a first control signal XCON1 for writing the write data in the DRAM 240a, to the DRAM 240a ⑤. However, the zero data processing unit 260 may transmit the write command CMD_wt to the DRAM 240a without additionally generating the first control signal XCON1.

The DRAM 240a may perform a write operation in response to the first control signal XCON1 ⑥ and may output a response RSP_wt for the write command, which notifies that the write operation is completed ⑦. The zero data processing unit 260 changes the first type area of the DRAM 240a, in which the write data which is non-zero data is written, to a second type area ⑧. For example, the zero data processing unit 260 may update a value of a random entry, which indicates whether a page is the first type area, from 1 to 0, in a look-up table, in order to change the page of the first type area to a page of the second type area. The second type area indicates the area in which the write data which is non-zero data is written. The zero data processing unit 260 may transmit the response RSP_wt for the write command, which notifies that the write operation is completed, to the central processing unit 220 ⑨.

According to another example embodiment of the present inventive concepts, the zero data processing unit 260 may control the DRAM 240a to perform a write operation of the write data to the first type area of the DRAM 240a before output a response RST_wt for the write command ⑨, and update a loop-up table to indicate that the write data in response to an address of the write command is stored in the first type area of the DRAM 240a⑧.

Figure 6:
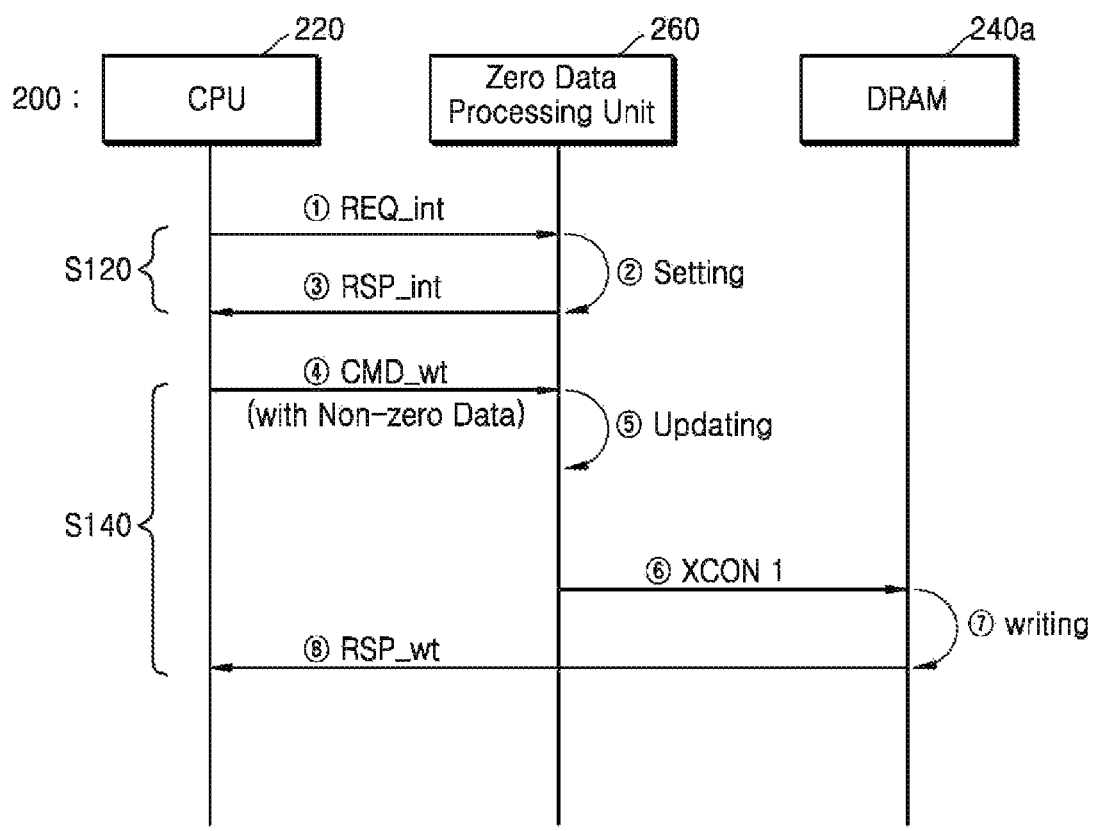

In FIG. 5, the zero data processing unit 260 performs the operation ⑧ of changing the first type area of the DRAM 240a, in which the write data which is non-zero data is written, to the second type area, after the operation ⑦ of receiving the response RSP_wt for the write command from the DRAM 240a, but it is not limited thereto. As illustrated in FIG. 6, the zero data processing unit 260 may first change the first type area to the second type area ⑤, when receiving the write command CMD_wt for writing the write data which is non-zero data in the first type area ④.

Also, in FIG. 5, the zero data processing unit 260 receives the response RSP_wt for the write command from the DRAM 240a ⑦, and transmits the received response RSP_wt to the central processing unit 220 ⑨, but it is not limited thereto. As illustrated in FIG. 6, without the operation of the zero data processing unit 260, the response RSP_wt for the write command may be transmitted to the central processing unit 220 ⑧.

According to another example embodiment of the present inventive concepts, the zero data processing unit 260 may update a loop-up table to indicate that the write data in response to an address of the write command is stored in the first type area of the DRAM 240a ⑤, and control the DRAM 240a to perform a write operation of the write data to the first type area of the DRAM 240a before output a response RST_wt for the write command ⑧.

Hereinafter, for convenience of explanation, the operation method of the mobile device 200 according to an example embodiment will be described according to the operation order of FIG. 5.

Figure 7:
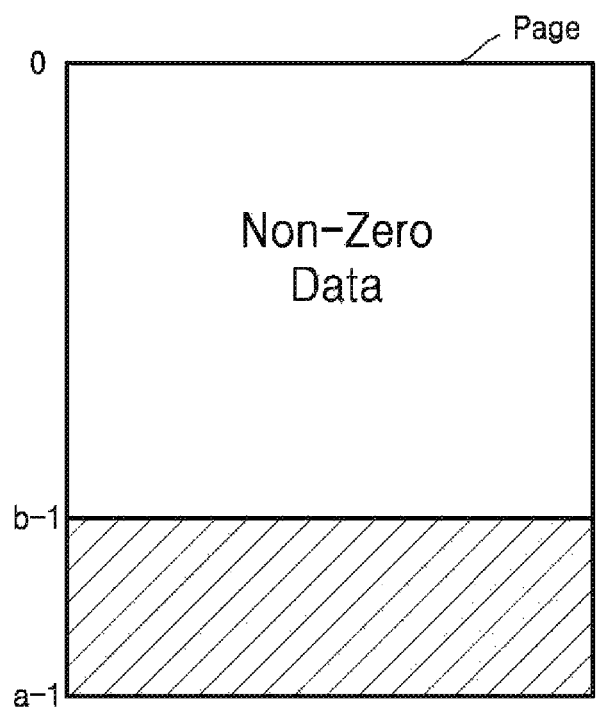
FIG. 7 is a view of an example in which write data is written in a page.

FIG. 7 is a view of an example in which the write data is written in a page. Referring to FIG. 7, via the operation illustrated in FIG. 5 or 6, the write data which is non-zero data may be written in the page of the DRAM 240a. Here, a size of the write data may be less than a size of the page. In FIG. 7, while the size of the page is a, the size of the write data may be b (a>b). If so, since an actual initialization is not performed for the page, an area of the page, in which the write data is not written, may still have data which was previously written, for example, the data which was used for executing an already finished application. In this case, the security problem may occur.

To prevent the security problem, the mobile device 200 may be operated in a method of FIG. 8, which will be described later. Although FIG. 7 is described based on a page, example embodiments are not limited thereto, and the method of FIG. 8 may be applied identically for the first type are in other units.

Figure 8:
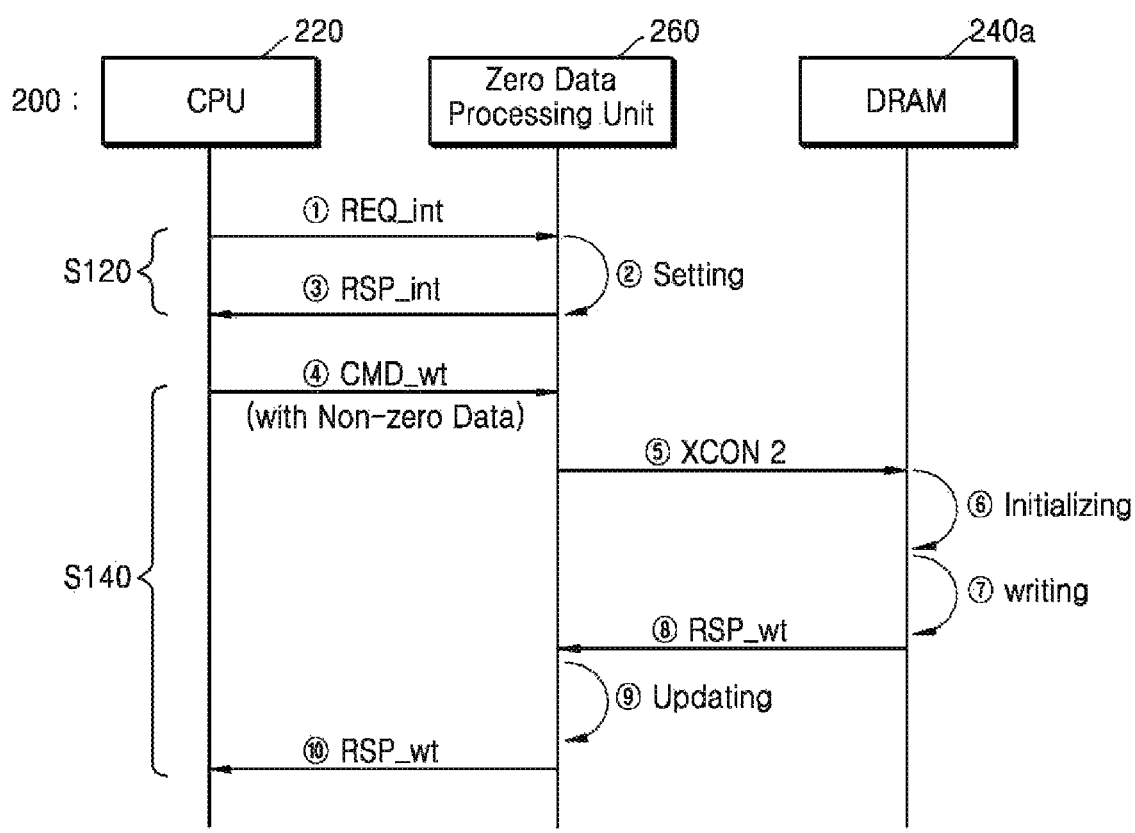
FIG. 8 is a view of an example of the operation method of the mobile device of FIG. 1, wherein an operation command with respect to a first type area is a write command for write data which is non-zero data, and a size of the write data is less than a size of a page.

FIG. 8 illustrates an example of the operation method of the mobile device 200 of FIG. 1, wherein the operation command with respect to the first type area is a write command for write command which is non-zero data, and a size of the write data is less than a size of the page. Referring to FIG. 8, the zero data processing unit 260 of the mobile device 200 may receive an initialization request REQ_int from the central processing unit 220 ①. In response to the initialization request REQ_int, the zero data processing unit 260 may set the first type area, which is not initialized despite the initialization request REQ_int ②. The zero data processing unit 260 may transmit a response RSP_int notifying that the initialization is performed, to the central processing unit 220, without initializing an area of the DRAM 240a, which corresponds to a plurality of pages, for which the initialization is requested ③.

Next, a write command CMD_wt for writing the write data which is non-zero data in the first type area of the DRMA 240a is activated from the central processing unit 220 ④. However, as illustrated in FIG. 7, the size of the write data may be less than the size of the page. The zero data processing unit 260 may analyze information related to the size of the write data included in the write command CMD_wt, and may determine whether the size of the write data is less than the size of the page. In this case, the zero data processing unit 260 may first initialize the first type area (page), and then, may transmit a second control signal XCON2 for writing the write data, to the DRAM 240a ⑤. However, the zero data processing unit 260 may transmit the write command CMD_wt to the DRAM 240a without additionally generating the second control signal XCON2. Here, by using a reserved for future use (RFU) area for which the write command CMD_wt is not defined, the zero data processing unit 260 may control to initialize the first type area (page) before the write command CMD_wt is performed.

The DRAM 240a may perform the initialization ⑥ and the write operations ⑦ with respect to the first type area, in response to the second control signal XCON2. The zero data processing unit 260 may receive a response RSP_wt for the write command from the DRAM 240a ⑧. The response RSP_wt for the write command notifies the zero data processing unit 260 that the write operation is completed. After changing the first type area of the DRAM 240a, to which the write data which is non-zero data has been written, to the second type area ⑨, the zero data processing unit 260 may transmit the response RSP_wt for the write command to the central processing unit 220 ⑩.

Through the above-described operations, a cache-hit ratio may be increased by performing the initialization when the security problem of FIG. 7 occurs, rather than performing the initialization in advance. The security problem described in FIG. 7 may be prevented by the method of FIG. 8. However, even if the first type area is set in a page unit, only the area (0~b-1 of FIG. 7) in which the write area which is non-zero data is written in a page may be changed to the second type area, and the area (b~a-1 of FIG. 7) in which the write data which is non-zero data is not written may be maintained as the first type area. In this case, as it will be described later, since the refresh operation is not performed on the first type area, previous data remaining in the first type area is lost, and thus, the security problem may be prevented even if the method of FIG. 8 is not performed. For example, a value indicating whether an address area is the first type area may be included in an RFU area (bit) from among address bits so that the first type area may be set in a unit less than a page. For example, in ARM v8, the first type area may be set in a unit less than a page, by using an address bit [58:55] reserved for software.

Figure 9:
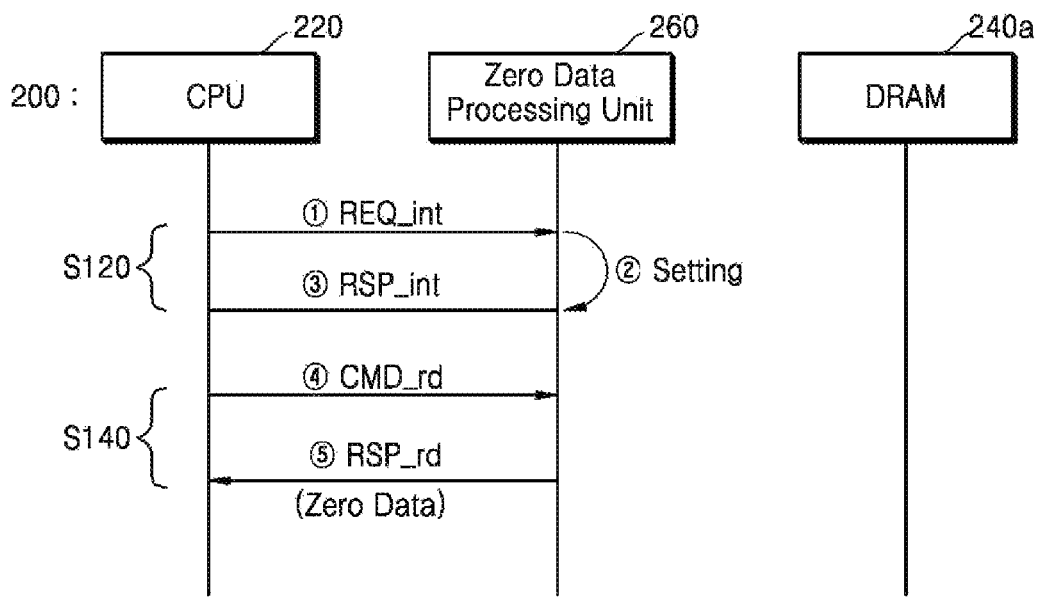
FIGS. 9 and 10 are views of examples of the operation method of the mobile device of FIG. 1, wherein an operation command with respect to a first type area is a read command.

FIG. 9 illustrates an example of the operation method of the mobile device 200 of FIG. 1, wherein the operation command for the first type area is a read command Referring to FIG. 9, the zero data processing unit 260 of the mobile device 200 may receive an initialization request REQ_int from the central processing unit 220 ①. In response to the initialization request REQ_int, the zero data processing unit 260 may set the first type area, which is not initialized despite the initialization request REQ_int ②. The zero data processing unit 260 may transmit a response RSP_int notifying that the initialization is performed, to the central processing unit 220, without initializing an area of the DRAM 240a, which corresponds to a plurality of pages, for which the initialization is requested ③.

Next, when a read command CMD_rd for reading read data of the first type area is activated from the central processing unit 220 ④, the zero data processing unit 260 may not access the DRAM 240a, that is, may not perform the read operation, and may transmit zero data to the central processing unit 220, as a response RSP_rd for the read command ⑤. That is because the zero data processing unit 260 may identify that a result of the reading operation is the zero data, without accessing the DRAM 240a.

Figure 10:
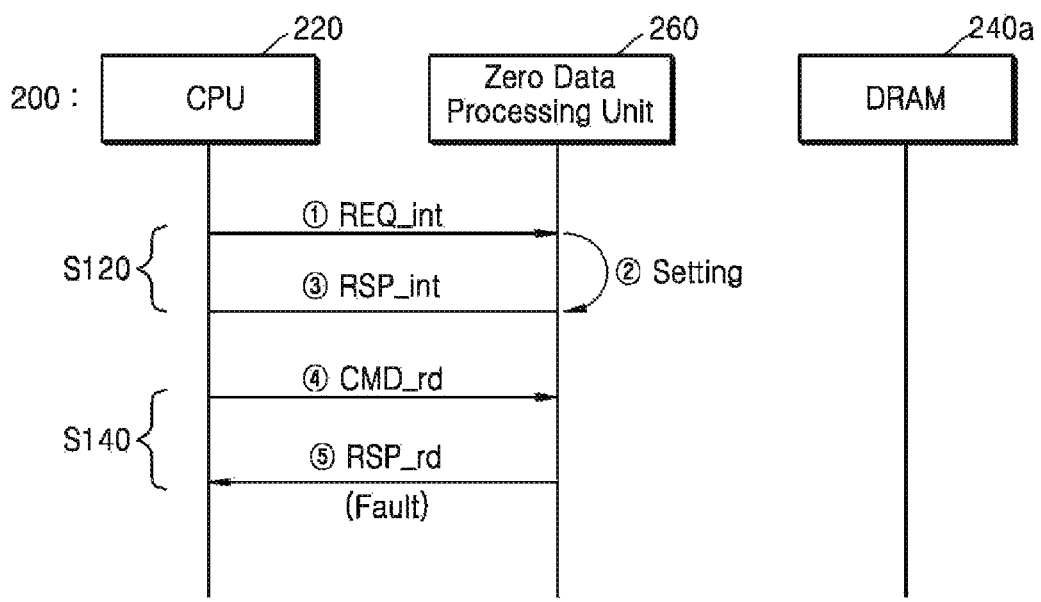

However, example embodiments are not limited thereto. As illustrated in FIG. 10, the zero data processing unit 260 may output permission fault as the response RSP_rd for the read command with respect to the first type area ⑤. For the generation of the permission fault, the zero data processing unit 260 may restrict an access right to the first type area, and information related to the access right may be stored in a look-up table, etc. For example, the zero data processing unit 260 may reject the access to the first type area or may set the access right as write only.

Figure 11:
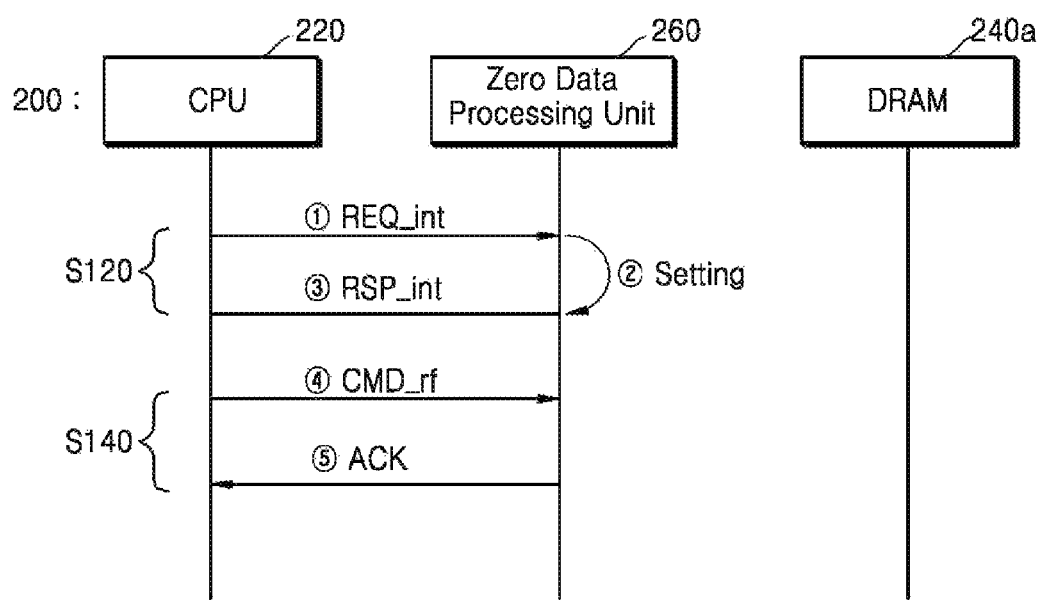
FIG. 11 is a view of an example of the operation method of the mobile device of FIG. 1, wherein an operation command with respect to a first type area is a refresh command.

FIG. 11 illustrates an example of the operation method of the mobile device 200 of FIG. 1, wherein the operation command for the first type area is a refresh command. Referring to FIG. 11, the zero data processing unit 260 of the mobile device 200 may receive an initialization request REQ_int from the central processing unit 220 ①. In response to the initialization request REQ_int, the zero data processing unit 260 may set the first type area, which is not initialized despite the initialization request REQ_int ②. The zero data processing unit 260 may transmit a response RSP_int notifying that the initialization is performed, to the central processing unit 220, without initializing an area of the DRAM 240a, which corresponds to a plurality of pages, for which the initialization is requested ③.

Next, when a refresh command CMD_rf for refreshing data of the first type area is activated from the central processing unit 220 ④, the zero data processing unit 260 may not transmit the refresh command CMD_rf to the DRAM 240a, and may transmit to the central processing unit 220 a response RSP_rf for the refresh command CMD_rf, which notifies that the refresh command CMD_rf is received ⑤. Thus, according to the mobile device and the operation method thereof according to an example embodiment, power consumption caused by the refresh operation may be reduced.

As shown above, the methods of processing the write command, the read command, and the refresh command, with respect to the memory area of the DRAM 240a, which is set as the first type area in response to the initialization request, are described. By writing the write data which is non-zero data, the first type area and the second type area may co-exist in the memory area of the DRAM 240a.

Figure 12:
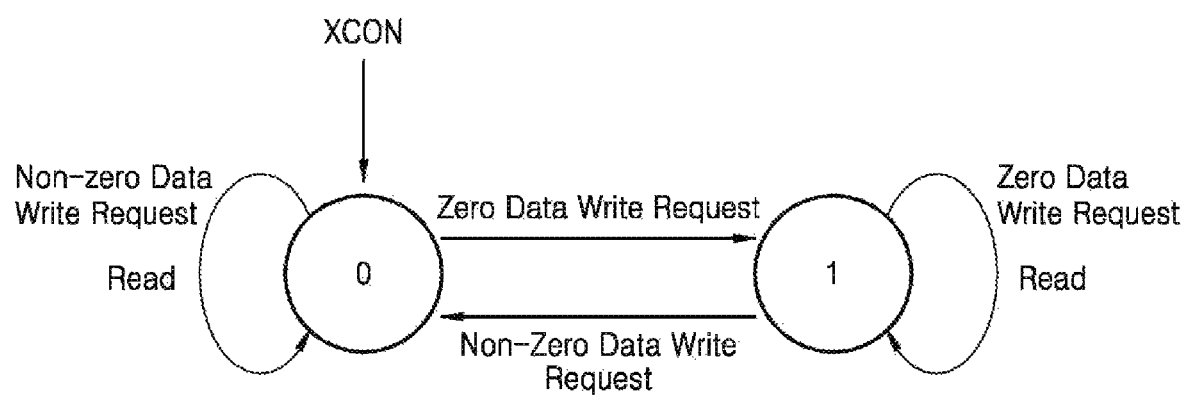
FIG. 12 is a view of an example of a state diagram indicating a state of a memory device after a write operation for write data which is non-zero data is performed.

FIG. 12 is a view of an example of a state diagram indicating a state of a memory area of the DRAM 240a after a write operation of the write data which is non-zero data is performed. Referring to FIG. 12, the memory area in which the write data which is non-zero data is written in response to a control signal XCON is set as the second type area. The control signal XCON may be the first control signal XCON1 which is described above. Here, an identifier (for example, a value of a random entry of a look-up table) indicating whether the memory area is the first type area or the second type area may be set as 0. Then, even when a read operation for the second type area or the write operation of the write data which is non-zero data for the second type area is requested, the value of the identifier is maintained as 0. However, when the zero data is requested to be written in the second type area, the second type area is changed to the first type area and the identifier has a value of 1.

With respect to the memory area changed to the first type area, even if a read operation or the write operation of the zero data is requested, the value of the identifier is maintained as 1. However, when the write data which is non-zero data is requested to be written in the first type area, the first type area is changed to the second type area, and the identifier may have the value of 0.

Hereinafter, the operation method of the mobile device 200, described in FIG. 12, will be described in more detail.

Figure 13:
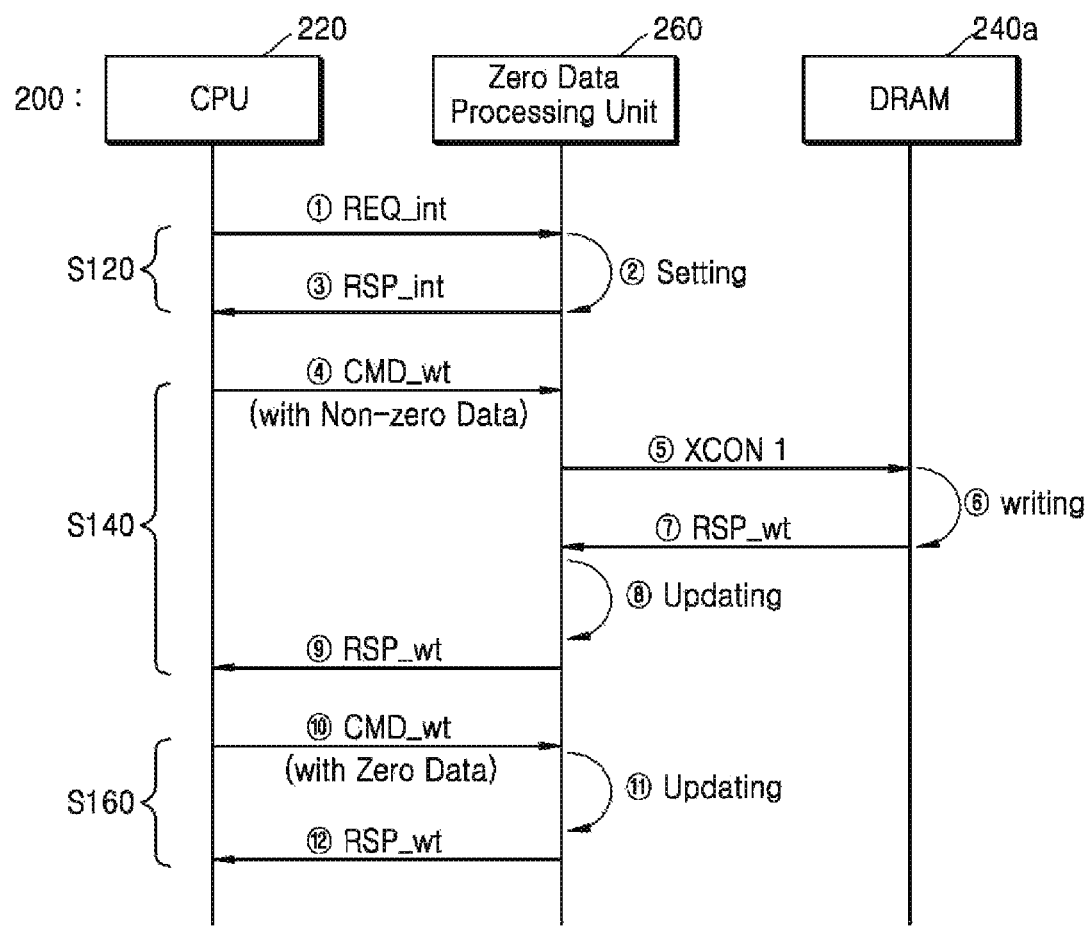
FIG. 13 is a view of an operation method of a mobile device according to an example embodiment, wherein an operation method with respect to a second type area is a write command for zero data.

FIG. 13 illustrates the operation method of the mobile device 200, according to an example embodiment, wherein an operation command with respect to the second type area is a write command for writing zero data. Referring to FIG. 13, in an area, which is set as the first type area in response to an initialization request REQ_int, by, for example, the method of FIG. 5, described above, the write data which is non-zero data may be written in the DRAM 240a in operations S120 and S140. In detail, the zero data processing unit 260 of the mobile device 200 may receive an initialization request REQ_int from the central processing unit 220 ①. In response to the initialization request REQ_int, the zero data processing unit 260 may set the first type area, which is not initialized despite the initialization request REQ_int ②. The zero data processing unit 260 may not initialize an area of the DRAM 240a, which corresponds to a plurality of pages, for which the initialization is requested, and may transmit a response RSP_int notifying that the initialization is performed, to the central processing unit 220 ③.

Next, when a write command CMD_wt for writing write data which is non-zero data in the first type area is activated from the central processing unit 220 ④, the zero data processing unit 260 may transmit the first control signal XCON1 for writing the write data in the DRAM 240a to the DRAM 240a ⑤. The DRAM 240a may perform a write operation in response to the first control signal XCON1 ⑥, and may output a response RSP_wt for the write command CMD_wt, which notifies that the write operation is completed ⑦. The zero data processing unit 260 may change the first type area of the DRAM 240a, in which the write data which is non-zero data is written, to the second type area ⑧. The zero data processing unit 260 may transmit the response RSP_wt for the write command, which notifies that the write operation is completed, to the central processing unit 220 ⑨.

Thereafter, the operation command for the second type area may be processed in operation S160. For example, the write command CMD_wt for writing zero data in the second type area may be activated ⑩. In response to the write command CMD_wt, the zero data processing unit 260 may not perform an access to the DRAM 240a, that is, may not perform the write operation, and may change the setting of the memory area, for which the write operation is requested, from the second type area to the first type area ⑪. Then, the zero data processing unit 260 may transmit the response RSP_wt for the write command CMD_wt, which notifies that the write operation is completed, to the central processing unit 220 ⑫.

Here, the write command CMD_wt for writing zero data in the second type area may be a bulk zero write command for writing plurality of pieces of zero data at once. If a total size of the zero data requested to be written by the bulk zero write command is n (n is a positive integer) times the size of a page, the page may be set as the first type area by using the look-up table as described above. When the total size of the zero data requested to be written by the bulk zero data write command is not n times the size of the page, the first type area may be set by using the reserved address bit described above.

Figure 14:
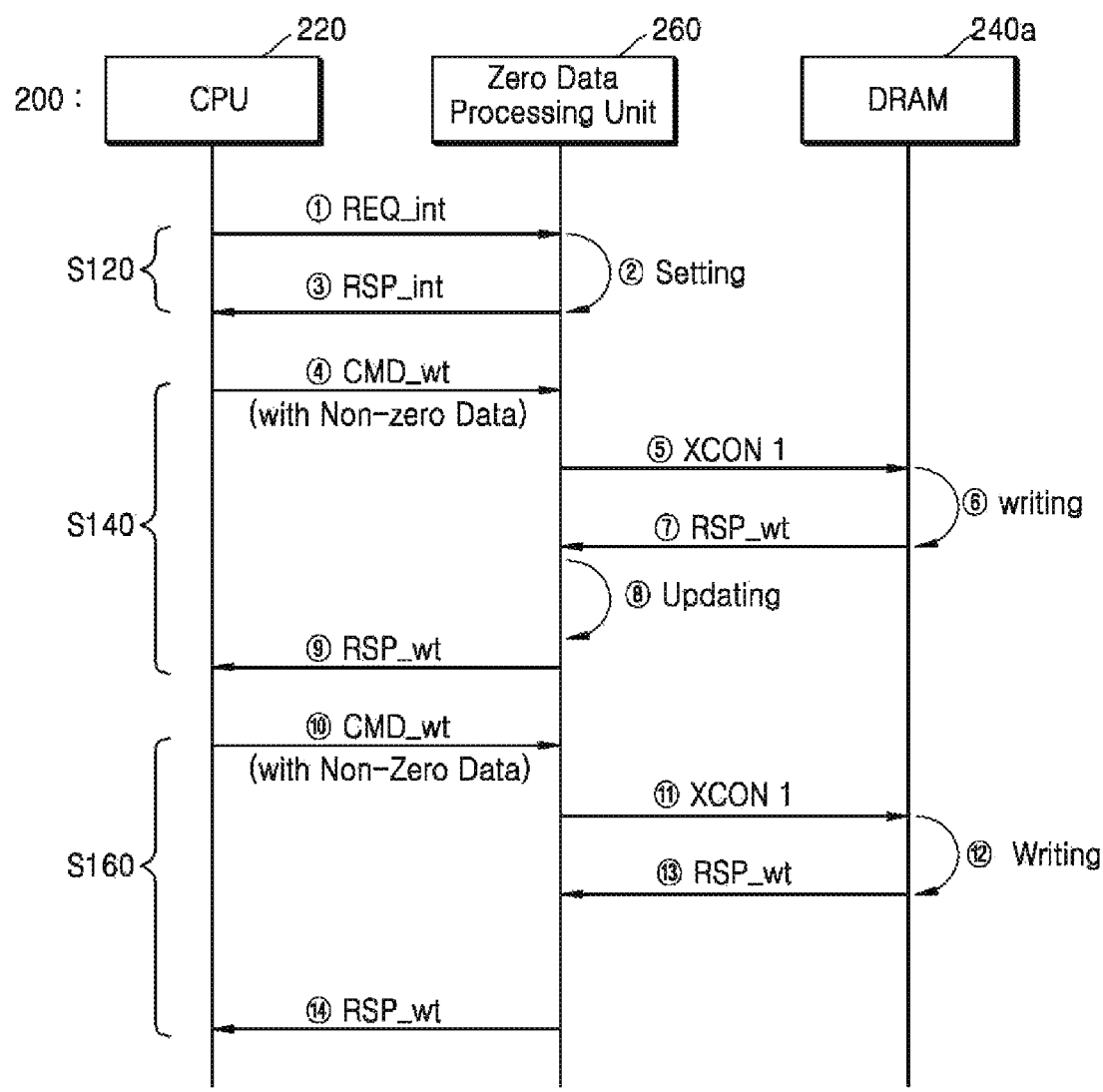
FIG. 14 is a view of an operation method of a mobile device according to an example embodiment, wherein an operation command with respect to a second type area is a write command for write data which is non-zero data.

FIG. 14 is a view of the operation method of the mobile device 200, according to an example embodiment, wherein an operation command with respect to the second type area is a write command for write data which is non-zero data. Referring to FIG. 14, with respect to the area, which is set as the first type area in response to an initialization request REQ_int, by, for example, the method of FIG. 5, the write data which is non-zero data may be written in the DRAM 240a in operations S120 and S140. Thus, the area that is set as the first type area in response to the initialization request REQ_int is changed to the second type area ⑦.

Thereafter, the operation command for the second type area may be processed in operation S160. For example, the write command CMD_wt for writing the write data which is non-zero data in the second type area may be activated ⑩. The zero data processing unit 260 may transmit a first control signal XCON1 for writing the write data in the DRAM 240a to the DRAM 240a ⑪. The DRAM 240a may perform a write operation in response to the first control signal XCON1 ⑫, and may output a response RSP_wt for the write command, which notifies that the write operation is completed ⑬. The zero data processing unit 260 may maintain the setting of the second type area and may transmit the response RSP_wt for the write command CMD_wt to the central processing unit 220 ⑭.

Figure 15:
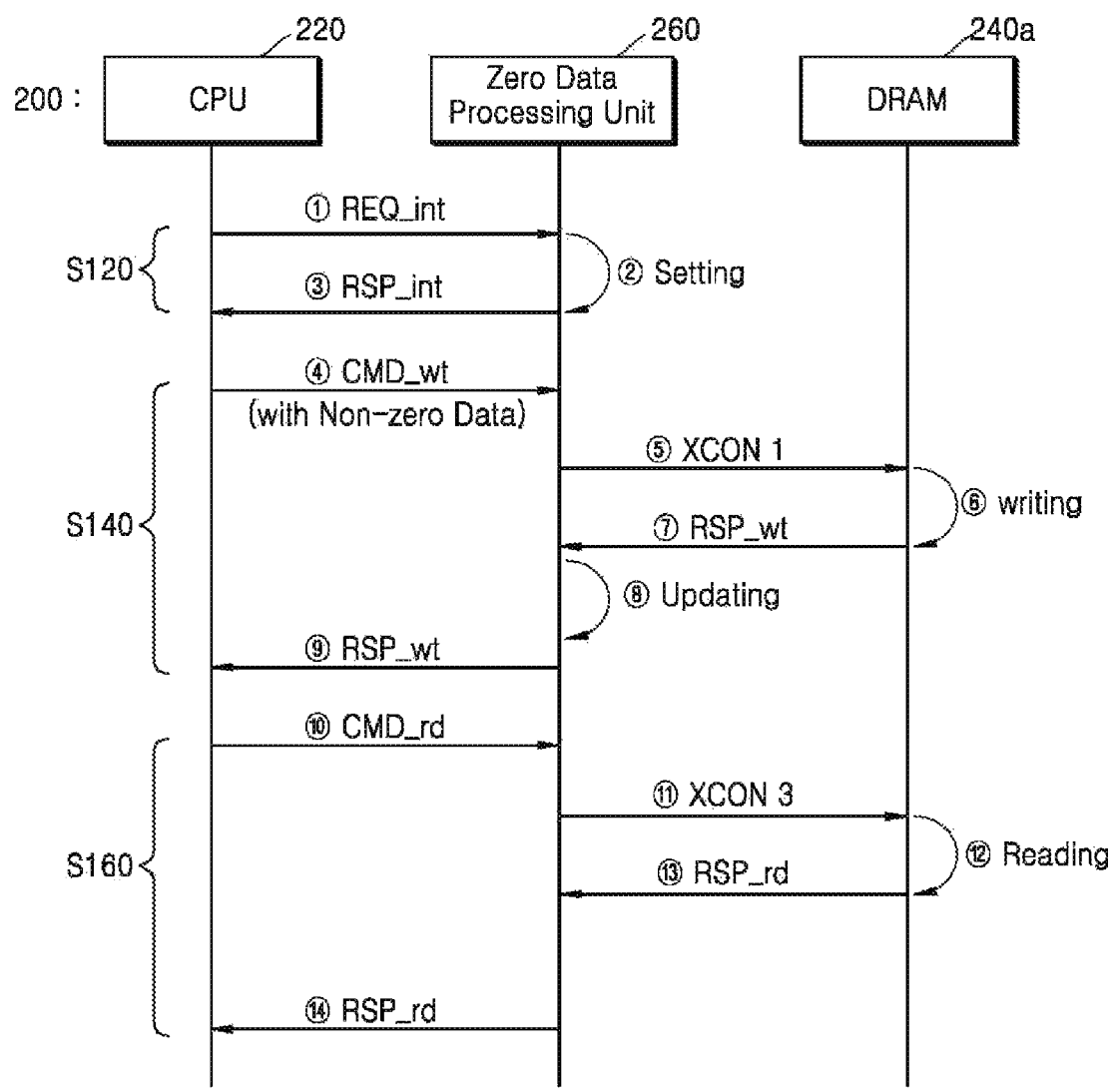
FIG. 15 is a view of an operation method of a mobile device according to an example embodiment, wherein an operation command with respect to a second type area is a read command.

FIG. 15 is a view of the operation method of the mobile device 200, according to an example embodiment, wherein an operation command with respect to the second type area is a read command Referring to FIG. 15, with respect to an area, which is set as the first type area in response to an initialization request REQ_int, by, for example, the method of FIG. 5, the write data which is non-zero data may be written in the DRAM 240a in operations S120 and S140. Thus, the area that is set as the first type area in response to the initialization request REQ_int is changed to the second type area ⑦.

Then, the operation command for the second type area may be processed in operation S160. For example, a read command CMD_rd for reading with respect to the second type area may be activated ⑩. The zero data processing unit 260 may transmit a third control signal XCON3 for reading to the DRAM 240a ⑪. The third control signal XCON3 may not be additionally generated, and the read command CMD_rd may be transmitted to the DRAM 240a. The DRAM 240a may perform a read operation in response to the third control signal XCON3 ⑫, and may output read data as a response RSP_rd for the read command CMD_rd ⑬. The zero data processing unit 260 may maintain the setting of the second type area and may transmit the response RSP_rd for the read command CMD_rd to the central processing unit 220 ⑭.

Figure 16:
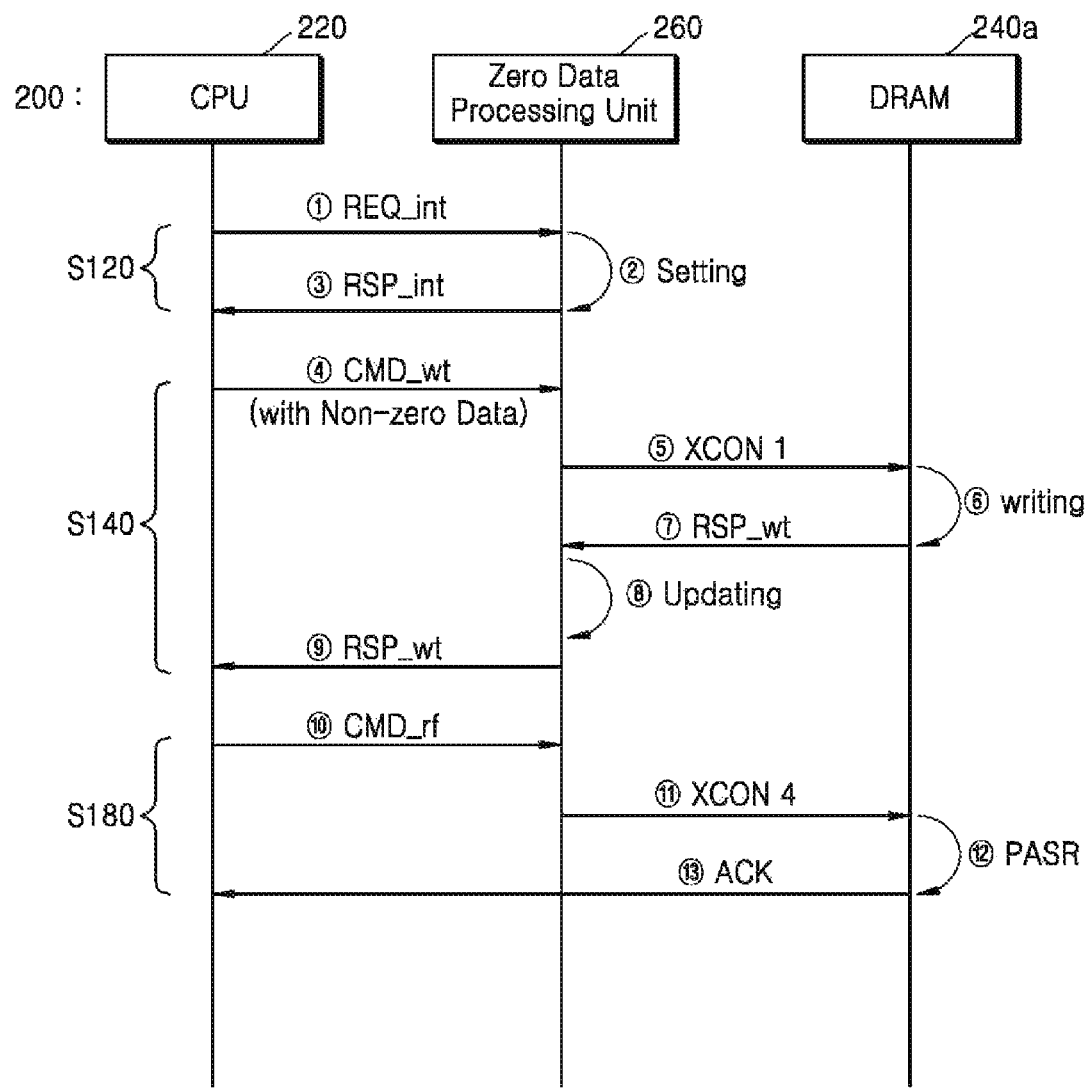
FIG. 16 is a view of an operation method of a mobile device according to an example embodiment, wherein a refresh operation is performed with respect to dynamic random access memory (DRAM) in which a first type area and a second type area co-exist.

FIG. 16 is a view of the operation method of the mobile device 200, according to an example embodiment, wherein a refresh operation is performed on the DRAM 240a in which the first type area and the second type area co-exist. Referring to FIG. 16, with respect to an area, which is set as the first type area in response to an initialization request REQ_int, by, for example, the method of FIG. 5, the write data which is non-zero data may be written in the DRAM 240a in operations S120 and S140. Thus, the area that is set as the first type area in response to the initialization request REQ_int is changed to the second type area ⑦.

Thereafter, the operation command for the DRAM 240a in which the first type area and the second type area co-exist may be processed in operation S180. For example, a refresh command CMD_rf for refreshing the DRAM 240a may be activated ⑩. The zero data processing unit 260 may transmit a fourth control signal XCON4 for refreshing the DRAM 240a to the DRAM 240a ⑪. The fourth control signal XCON4 may not be additionally generated and the refresh command CMD_rf may be transmitted to the DRAM 240a. In response to the fourth control signal XCON4, the DRAM 240a may not perform the refresh operation on the first type area, and may perform the refresh operation only on the second type area ⑫. For example, the DRAM 240a may operate in a partial array self refresh (PASR) mode, and may refresh only the second type area. The PASR method is a method of performing a refresh operation only on some memory cells rather than the whole memory cells of the DRAM 240a. The PASR mode may be performed by a setting of a mode register set (MRS).

The zero data processing unit 260 may maintain the setting of the first type area and the second type area, and may transmit a response RSP_rf for the refresh command to the central processing unit 220 ⑬. Thus, according to the mobile device 200 and the operation method thereof according to the example embodiments, power consumption and the operation delay caused by the refresh operation may be prevented.

Figure 17:
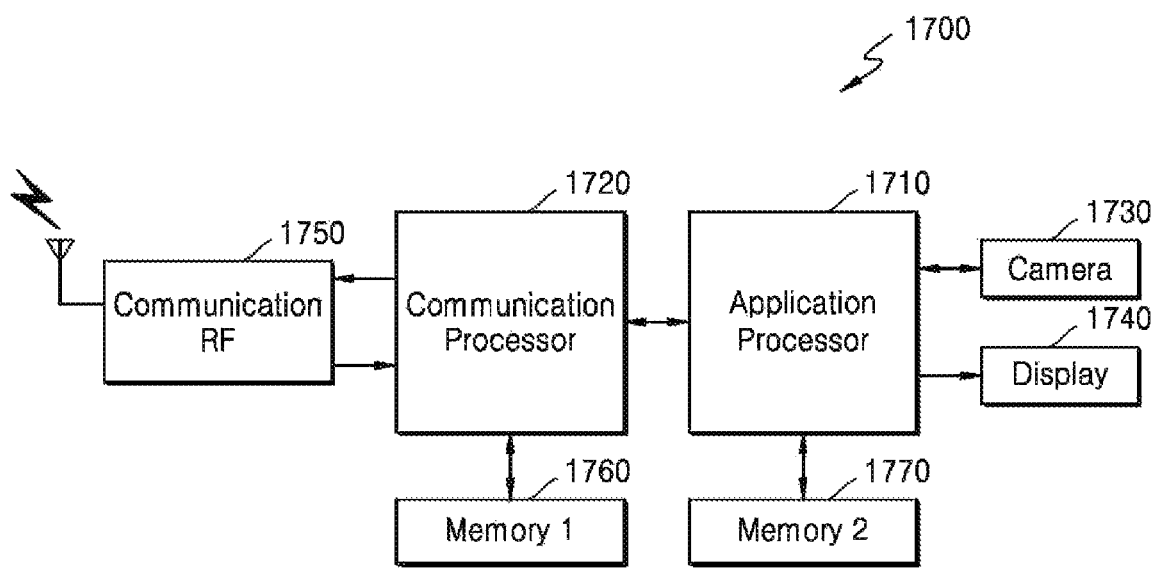
FIG. 17 is a view of a mobile device according to an example embodiment.

FIG. 17 is a view of a mobile device 1700 according to an example embodiment. Referring to FIG. 17, the mobile device 1700 may include an application processor 1710, a communication processor 1720, a camera 1730, a display 1740, a communication radio frequency (RF) 1850, and memories 1760 and 1770, which are embodied as a system on chip. Applications may be executed in the mobile device 1700 by the application processor 1710. For example, when an image is captured by the camera 1730, the application processor 1710 may store the captured image in the second memory 1770 and display the image in the display 1740. The second memory 1770 may be the memory device 240 of FIG. 2. The application processor 1710 may include the central processing unit 220 and the zero data processing unit 260 of FIG. 2. The captured image may be transmitted to the outside by the communication RF 1750 according to a control of the communication processor 1720. Here, the communication processor 1720 may temporarily store the image in the first memory 1760 in order to transmit the image. In addition, the communication processor 1720 may control communication for phone services and for data exchanging.

Figure 18:
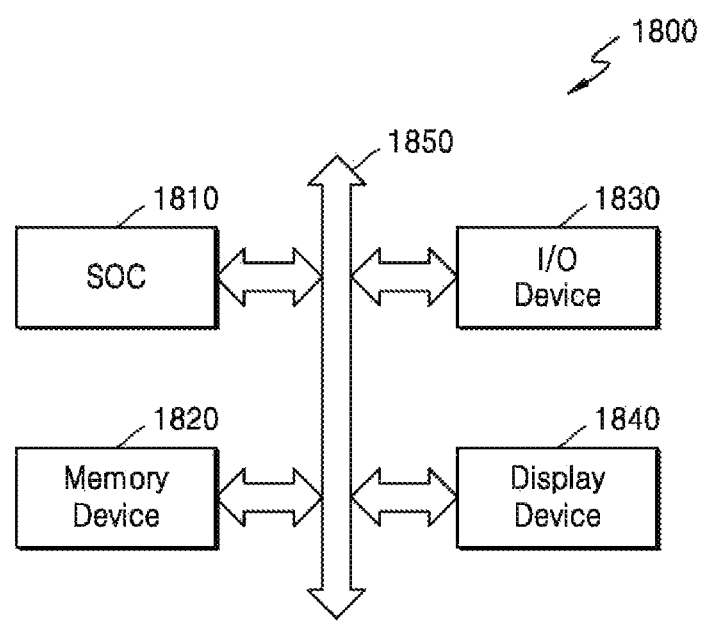
FIG. 18 is a view of a computing system according to an example embodiment.

FIG. 18 is a view of a computing system according to an example embodiment. Referring to FIG. 18, the computing system 1800 may further include a system on chip 1810, a memory device 1820, an input and output device 1830, and a display device 1840, which may be connected via a bus 1850. The system on chip 1810 of FIG. 18 may include the central processing unit 220 and the zero data processing unit 260 of FIG. 2. The memory device 1820 may be the memory device 240 of FIG. 2.

Figure 19:
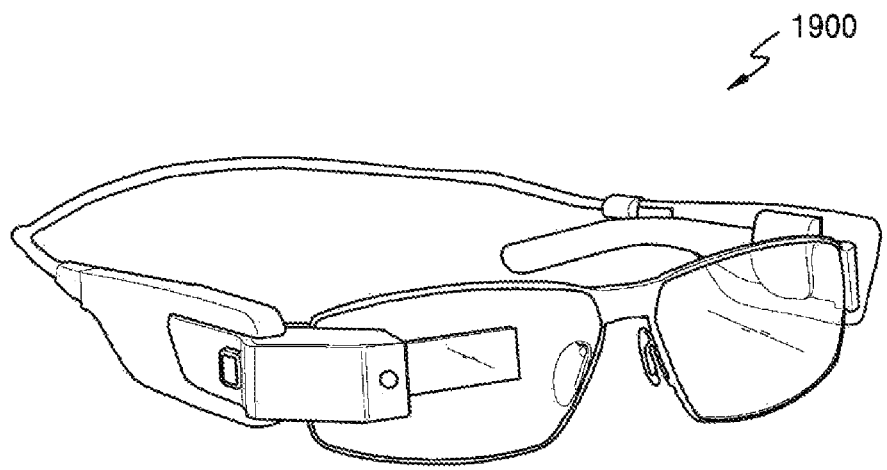
FIGS. 19 and 20 are views of mobile devices according to example embodiments.
Figure 20:
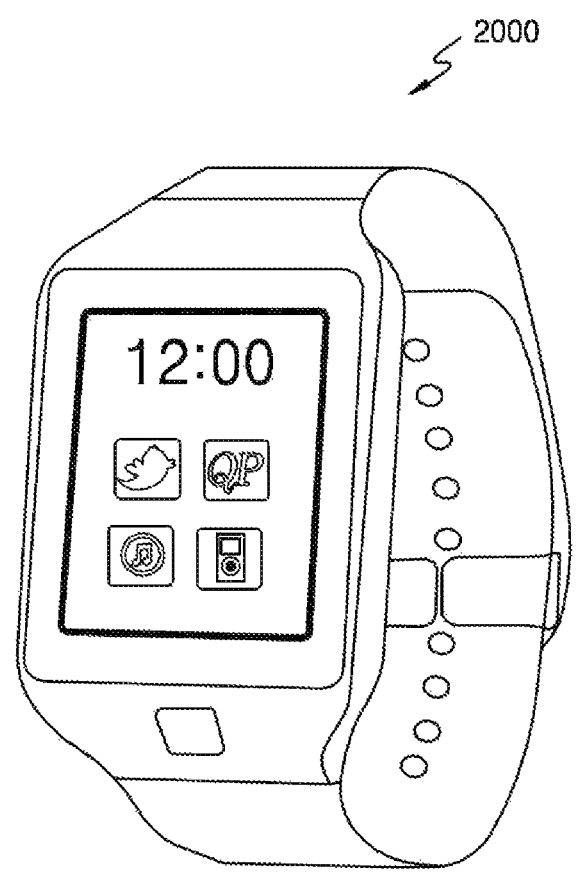

FIGS. 19 and 20 are views of mobile devices 1900 and 2000 according to example embodiments. The mobile device 1900 may be embodied as a wearable device, for example, smart eyeglasses, as illustrated in FIG. 19. Alternatively, the mobile device 2000 may be embodied as a wearable device, for example, a smart watch, as illustrated in FIG. 20. The wearable devices may have a problem in terms of power consumption and a limit of memory bandwidths. However, according to the mobile device and the operation method thereof according to the example embodiments, since the problems of power consumption and memory bandwidths may be prevented, effective operations may be performed.

While the inventive concept has been particularly shown and described with reference to example embodiments thereof, it will be understood that various changes in form and details may be made therein without departing from the spirit and scope of the following claims.

What is claimed is:

1. An operation method of a mobile device including a central processing unit and a memory device, comprising:
   in response an initialization request received from the central processing unit, setting a memory area of the memory device corresponding to the initialization request as a first type area without initializing the first type area with a first value;
   notifying the central processing unit of a signal indicating that, without the initializing of the first type area in response to the initialization request, the initialization request has been performed on the first type area;
   in response to a first write command to write a second value received from the central processing unit, setting a memory area of the memory device corresponding to the first write command as a second type area;
   and in response to a refresh command for the memory device received from the central processing unit, performing a partial array self-refresh (PARS) operation on the second type area.

2. The method of claim 1, wherein the setting a memory area of the memory device corresponding to the initialization request as a first type area comprises setting at least one first type area in at least one of a channel unit, a rank unit, a bank unit, a sub-array unit, and a page unit.

3. The method of claim 1, further comprising:
   receiving a second write command for write data having the first value from the central processing unit; and
   notifying the central processing unit of a write complete signal corresponding to the first second write command without performing the second write command on the first type area, wherein an address of the second write command indicates to the first type area.

4. The method of claim 3,
   wherein the second write command and the write data having the first value do not transmit from the central processing unit to the memory device.

5. The method of claim 1, further comprising:
   receiving a third write command for write data having the second value from the central processing unit;
   writing, in response to the third write command, the write data having the second value to the first type area.

6. The method of claim 5, further comprising:
   if a size of the write data is less than a size of the first type area, initializing all of the first type area in response to the receiving the third write command; and
   changing the first type area to the second type area.

7. The method of claim 1, further comprising:
   receiving a first read command with respect to the first type area from the central processing unit; and
   outputting the first value as a processing result of the first read command without accessing the first type area.

8. The method of claim 1, further comprising:
   restricting an access right of the central processing unit to the first type area;
   receiving a first read command with respect to the first type area from the central processing unit; and
   outputting a permission fault in response to the first read command.

9. The operation method of claim 1, further comprising:
   receiving from the central processing unit a refresh command with respect to the first type area; and
   notifying receipt of the refresh command to the central processing unit without performing the refresh command on the first type area.

10. The method of claim 1, further comprising:
    receiving from the central processing unit a fourth write command for writing write data having the first value to the second type area of the memory device;
    transmitting to the central processing unit, without writing the write data to the second type area, a write complete signal corresponding to the fourth write command; and
    changing the second type area to the first type area.

11. The method of claim 1, further comprising:
    activating the refresh command with respect to the memory device; and
    in response to the refresh command, operating the memory device in a partial array self refresh (PASR) mode, and not performing a refresh operation on the first type area and performing the refresh operation on the second type area.

12. The operation method of claim 11, wherein the setting of the first type area comprises setting the first type area in a page unit, and
    setting a value of a first entry of a look-up table, with respect to each page of the first type area, to a value different from a value of a first entry of the look-up table, with respect to each page in the second type area.

13. The operation method of claim 1, wherein the memory device comprises dynamic random access memory (DRAM).

* * * * *